(12) United States Patent
Ih

(10) Patent No.: US 6,417,017 B1
(45) Date of Patent: Jul. 9, 2002

(54) OPTOSEMICONDUCTOR DEVICE AND THE METHOD FOR ITS MANUFACTURE

(75) Inventor: Teng-Yul Ih, Chonbuk (KR)

(73) Assignee: AUK Co., Ltd., Chonbuk (KR)

( * ) Notice: Subject to any disclaimer, the term of this patent is extended or adjusted under 35 U.S.C. 154(b) by 0 days.

(21) Appl. No.: 09/799,289

(22) Filed: Mar. 5, 2001

(30) Foreign Application Priority Data

Dec. 9, 2000 (KR) .............................................. 00-74978

(51) Int. Cl.$^7$ ................................................ H01L 21/00
(52) U.S. Cl. ......................................... 438/22; 257/98
(58) Field of Search .............................. 438/22, 25–28, 438/160; 257/98, 99, 100, 789, 795

(56) References Cited

U.S. PATENT DOCUMENTS

| | | | | |
|---|---|---|---|---|
| 3,607,710 A | * | 9/1971 | Farren et al. ................ | 204/195 |
| 4,247,864 A | * | 1/1981 | Lockard ....................... | 357/79 |
| 4,827,118 A | * | 5/1989 | Shibata et al. ............... | 250/211 |
| 5,177,593 A | * | 1/1993 | Abe ............................. | 257/98 |
| 5,198,479 A | * | 3/1993 | Shiobara et al. ............. | 523/214 |
| 5,614,131 A | * | 3/1997 | Mukerji et al. .............. | 264/1.9 |
| 5,793,062 A | * | 8/1998 | Kish, Jr. et al. .............. | 257/98 |
| 6,274,890 B1 | * | 8/2001 | Oshio et al. .................. | 257/98 |

\* cited by examiner

*Primary Examiner*—David Nelms
*Assistant Examiner*—David Vu
(74) *Attorney, Agent, or Firm*—Howrey, Simon, Arnold & White, L.L.P.; Jeffrey E. Kubiak; Terril G. Lewis

(57) ABSTRACT

The present invention relates to an optosemiconductor device, improved in light-emission efficiency and heat-radiation capability due to its production by molding an anode lead frame and a cathode lead frame with transmission-type epoxy resin and by forming, in the lower end part of the said transmission-type epoxy resin, a layer either of reflective heat-radiating epoxy resin (organic, inorganic, metallic) which contains a heat-radiating filler or of reflective heat-radiating epoxy resin (organic, inorganic, metallic) of mixed hues, along with a method for its manufacture; and by producing this optosemiconductor device by placing such resin as has a filler of a reflective and highly heat-radiating(organic, inorganic, metallic) epoxy resin or reflective heat-radiating(organic, inorganic, metallic) epoxy resin of mixed hues at the lower end of the transmission-type epoxy resin, the present invention is enabled both to prevent the thermal aging inherent in the conventional light-emitting or light-receiving diodes, to produce semiconductor devices of desired wavelength range, and to achieve products of high efficiency in emission or reception of light.

14 Claims, 2 Drawing Sheets

OPTOSEMICONDUCTOR DEVICE AND THE METHOD FOR ITS MANUFACTURE

TECHNICAL FIELD OF THE INVENTION

The present invention relates to an optosemiconductor device and the method for its manufacture, and especially to a method for producing an optosemiconductor device, which is greatly improved in its light emission efficiency and heat-radiation capability.

BACKGROUND OF THE INVENTION

Generally, optosemiconductor devices are such parts as perform transmission of light via electric signals, and are largely classified into ordinary light-emitting diodes, which convert electric signals into optical signals and use them in forward output and light-receiving diodes (phototransistors, photodiodes, triac, photo IC), which receive optical signals and convert them into electric signals. These optosemiconductor devices are manufactured in products of a wide wavelength range, from visual to infrared lights, according to the different kinds, density, and structure of the impurities forming the PN junction of semiconductor crystals.

Below, the optosemiconductor devices are described, taking the light-emitting diode as example.

The light-emitting diode is a light-emitting element so called an injection-type electro-luminescence of the p-n junction, and it can operate with very low voltage and has a long life span, wherefore, it is in very wide use as solid indicating element or as indicator of pictorial images, etc.

The structure of the light-emitting diode is given in FIG. 1. It consists of a chip 2 which emits light when power is applied to a cathode lead 3 and anode lead 4, both the latter made of a conductive metallic material for application of electricity to the said chip 2; the said chip 2 being attached to a pad 5 of the shape of a cup formed on an end of the said cathode lead 3 by conductive adhesive, and at the same time is bonded with the end of the said anode lead 4 by a wire 6, that is, electrically connected between the said cathode lead and anode lead 3, 4.

As is seen in FIG. 2, the said chip 2 is molded by a mold 7 of an insulation material for its protection against influence from outside, but it is so structured that parts of the other ends of both the cathode lead and anode lead 3, 4 are exposed to outside so that power can be delivered to the said chip 2 from outside.

When the said exposed parts of both the cathode lead and anode lead 3, 4 of the light-emitting diode 1 are connected electrically with a circuit and power is delivered to the said chip 2 through the said cathode lead and anode lead 3, 4, the light-emitting diode begins to emit light. the mold 7 is generally composed of epoxy resin and is made, according to the wavelength of the light-emitting diode 1, in red, green, orange, and other colors, or colorless transparency.

However, in the existing diodes like this, the emission of light of the light-emitting elements invariably gets lower under the mounting thermal stresses inside the package, while their light-receiving elements are apt to suffer deterioration of their light-receiving efficiency by decrease in the amount of light they convert to electric signals, if they are subject to prolonged use.

In the case of ideal light-emitting diode, the emission of light is in proportion to the forward current. This is limited to the case of an ideal light-emitting element which does not generate heat. Otherwise, as the forward current increases, the temperature of the light-emitting diode rises causing the light emission efficiency to decline. In short, the rise of temperature in the light-emitting member does not merely degrade the light-emission efficiency but destroys the junction of the p-n joining of the light-emitting chip, thus causing decrease of its duration.

In other words, if the heat generated in the light-emitting (or light-receiving) chip is not efficiently discharged out of the package the light-emission efficiency (the light-reception efficiency in the case of the light-receiving element) of the chip degrades and its reliability cannot be secured.

SUMMARY OF THE INVENTION

The present invention is intended to overcome these problems by providing an opto-semiconductor device excellent in heat-radiation and of high reliability along with a method for its manufacture.

Another objective of the present invention is to provide an optosemiconductor device of a desired wavelength range by combining fillers of various hues and a method for its manufacture.

Yet another objective of the present invention is to provide an optosemiconductor device which has an improved efficiency in light emission by radiating the light in the forward direction without loss, along with a method for its manufacture.

BRIEF DESCRIPTION OF THE INVENTION

Figure 4:
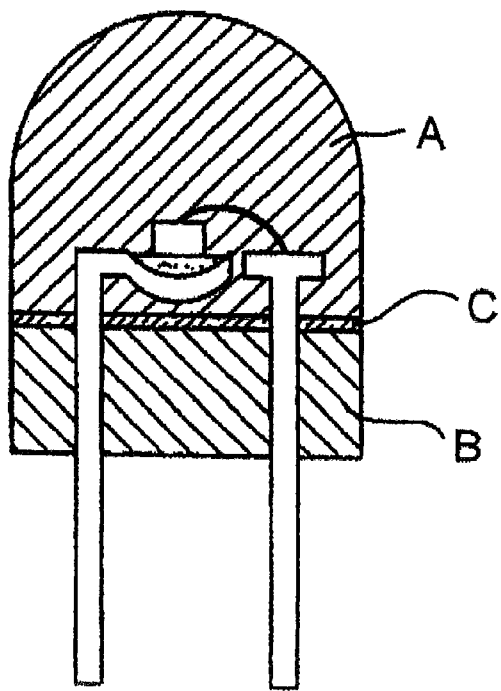

FIG. 4 a vertical sectional view of the optosemiconductor device produced in another embodiment example of the present invention.

BEST EMBODIMENT CARRYING OUT THE INVENTION

Figure 1:
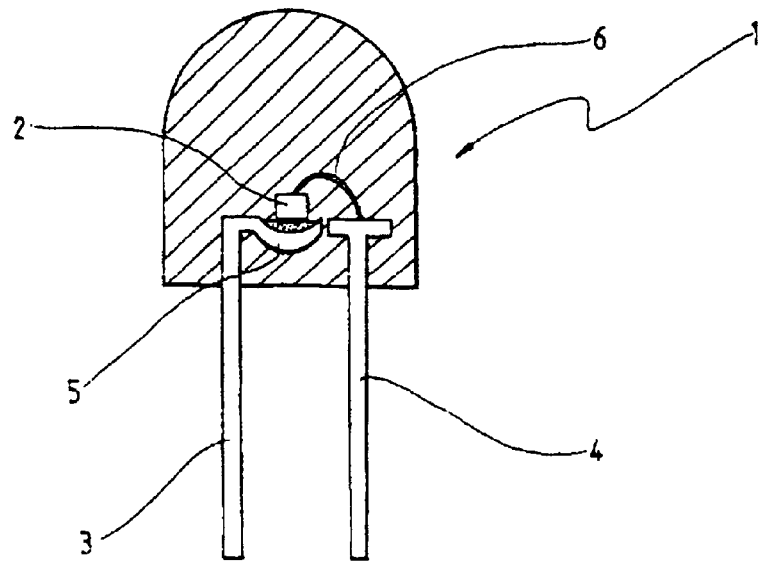
FIG. 1 is a vertical sectional view of a conventional light-emitting (light-receiving) diode.
Figure 2:
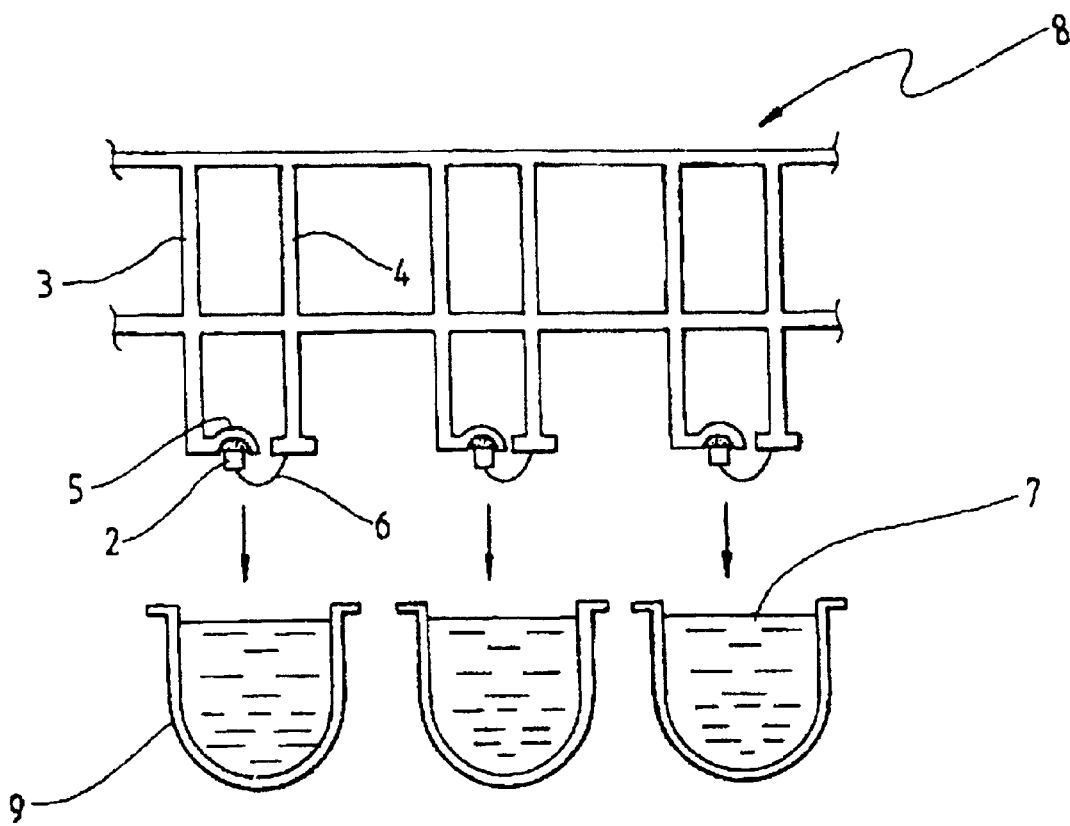
FIG. 2 is an illustration to show the process for producing a conventional light-emitting (light-receiving) diode.
Figure 3:
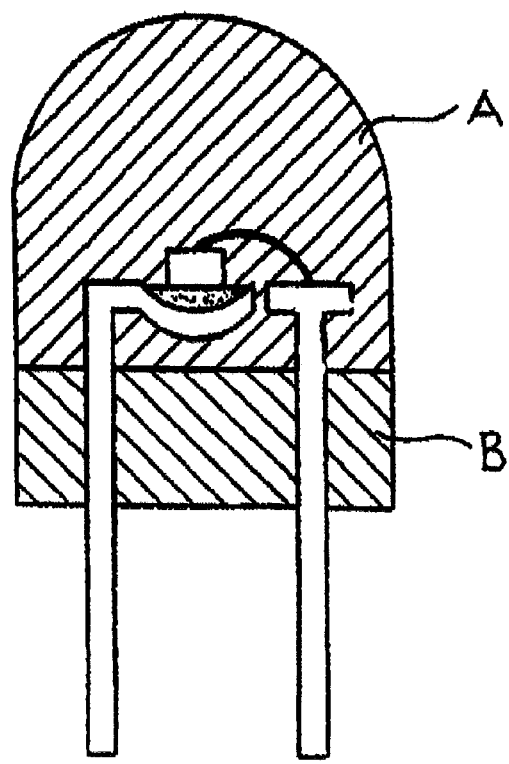
FIG. 3 is a vertical sectional view of the optosemiconductor device produced in an embodiment example of the present invention.

Below, the optosemiconductor device of the present invention and the method for its manufacture are described in detail, the attached drawings being referred to at need:

FIG. 3 is a vertical sectional view of the optosemiconductor device according to an embodiment example of the present invention. As is shown in the drawing, the structure of the optosemiconductor device of the present invention consists of an anode lead frame 3; a cathode lead frame 4; a conductive wire 6 for current flow between the said anode lead frame 3 and a light-emitting chip 2; transmission-type epoxy resin A which has molded parts of the said two lead frames 3. 4; reflective light-radiating epoxy resin containing a heat-radiating filler B or colored epoxy resin B containing a color filler formed at the lower end of the said transmission epoxy resin A.

The conventional optosemiconductor devices are packed into packages, including epoxy resin which materialized hues of green, red, yellow, black, etc., according to the wave-length of the light-emitting chip 2. In contrast, the optosemiconductor device of the present invention, unlike in the conventional techniques, uses transmission-type epoxy resin A in the parts of the two lead frames 3, 4 but forms the lowest end of the package of reflective heat-radiating epoxy resin or hues according to the wavelength range of the chip.

In the method like this for manufacture of the optosemiconductor device, a pair of frames are arranged in a number of sets in a number of lines; each single lead frame is dotted with conductive adhesive; the conductive adhesive is die-bonded with an optical chip; the said lead frames are bonded by electrodes with the said optical chip with gold wire; transmission-type epoxy resin is potted in a molding cup which takes the shape of a vessel for each constituent of the packages; either reflective heat-radiating (organic, inorganic, metallic) epoxy resin or such epoxy resin as induces various hues (wavelength) is potted in the said molding cup, and after it gets hardened a trimming process is performed to unify the packages.

FIG. 4 is a vertical sectional view of the optosemiconductor device in another embodiment example of the present invention, and unlike the example in FIG. 3, shows a case in which a reflective material C is formed between the transmission-type epoxy resin layer A and heat-radiating epoxy layer B. Being an insulation material, this reflective material is intended to reflect back the light reflected from an epoxy lens. Thus the loss of the light reflected from the transmission-type epoxy can be prevented.

As has been described above, by manufacturing an optosemiconductor device through formation in the lower end of the layer of the transmission-type epoxy resin of a layer of resin inserted with a reflective and highly heat-radiating (organic, inorganic, metallic) filler and a filler (organic, inorganic, metallic) of various wavelength ranges, it is possible in the present invention to prevent the thermal aging inherent in the conventional light-emitting or light-receiving diode and simultaneously, by materializing hues of various wavelength ranges, to provide a product of high light-emitting or light-receiving efficiency.

What is claimed is:

1. A method for manufacturing an optosemiconductor device, comprising in sequence:

(a) potting a transmissive epoxy and an optoelectronic chip in a mold cup, wherein said optoelectronic chip is embedded in said transmissive epoxy and said transmissive epoxy forms a first surface; and (b) potting a reflective epoxy onto said first surface.

2. The method of claim 1, wherein the optoelectronic chip is fully embedded in said transmissive epoxy.

3. The method of claim 1, wherein the first surface is planar.

4. The method of claim 1, wherein the optoelectronic chip has an active surface, and wherein the active surface faces away from the first surface.

5. The method of claim 1, wherein the reflective epoxy is heat radiating.

6. A method for manufacturing an optosemiconductor device comprising: (a) potting a transmissive epoxy in a mold cup, (b) potting a reflective material over the transmissive epoxy within the mold cup, and (c) potting a heat-radiating epoxy over the reflective material within the mold cup.

7. A method for manufacturing an optosemiconductor device, comprising in sequence:

(a) potting a transmissive epoxy and an optoelectronic chip in a mold cup, wherein said optoelectronic chip is embedded in said transmissive epoxy and said transmissive epoxy forms a first surface; and (b) potting a heat radiating epoxy onto said first surface.

8. An optosemiconductor device which is manufactured by any one of the methods given in claims 1, 6, and 7.

9. The method of claim 7, wherein the optoelectronic chip is fully embedded in said transmissive epoxy.

10. The method of claim 7, wherein the first surface is planar.

11. The method of claim 7, wherein the optoelectronic chip has an active surface, and wherein the active surface faces away from the first surface.

12. The method of claim 7, wherein the reflective epoxy is heat radiating.

13. The method of claim 7, further comprising potting a reflective material at the first surface between the transmissive epoxy and the heat radiating epoxy.

14. The method of claim 7, wherein the heat radiating epoxy is reflective.

* * * * *